United States Patent
Yuan et al.

(10) Patent No.: US 11,886,020 B2
(45) Date of Patent: Jan. 30, 2024

(54) RING RESONATOR WITH INTEGRATED DETECTOR FOR MONITORING LIGHT COMPRISING AN ANNULAR DETECTION REGION THAT IS PHYSICALLY ISOLATED FROM A WAVEGUIDE CORE

(71) Applicant: Hewlett Packard Enterprise Development LP, Houston, TX (US)

(72) Inventors: Yuan Yuan, Milpitas, CA (US); Sudharsanan Srinivasan, Santa Barbara, CA (US); Di Liang, Santa Barbara, CA (US); Zhihong Huang, Milpitas, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 164 days.

(21) Appl. No.: 17/305,892

(22) Filed: Jul. 16, 2021

(65) Prior Publication Data
US 2023/0014190 A1   Jan. 19, 2023

(51) Int. Cl.
G02B 6/42   (2006.01)

(52) U.S. Cl.
CPC .................. G02B 6/4201 (2013.01)

(58) Field of Classification Search
CPC .............. G02B 6/4201; G02B 6/29338; H01L 31/02327; H01L 31/028; H01L 31/035281; H01L 31/105; G02F 2203/15; G02F 1/0151
USPC ............................................ 250/227, 227.11
See application file for complete search history.

(56) References Cited

U.S. PATENT DOCUMENTS

| | | | |
|---|---|---|---|
| 7,613,369 B2 | 11/2009 | Witzens et al. | |
| 9,134,169 B2 | 9/2015 | Li et al. | |
| 9,261,716 B2* | 2/2016 | Akiyama | G02F 1/0147 |
| 9,310,562 B2 | 4/2016 | Zheng et al. | |
| 2014/0110572 A1* | 4/2014 | Li | G02F 1/025 |
| | | | 250/227.23 |
| 2015/0372159 A1 | 12/2015 | Englund et al. | |
| 2021/0013265 A1* | 1/2021 | Hinata | H10K 59/38 |

OTHER PUBLICATIONS

Bogaerts et al., "Silicon Microring Resonators," Laser & Photonics Reviews, vol. 6, No. 1, 2012, pp. 47-73.
(Continued)

*Primary Examiner* — Que Tan Le
*Assistant Examiner* — Mai Thi Ngoc Tran
(74) *Attorney, Agent, or Firm* — Hewlett Packard Enterprise Patent Department

(57) ABSTRACT

Examples described herein relate to a ring resonator. The ring resonator may include an annular waveguide having a waveguide base and a waveguide core narrower than the waveguide base. Further, the ring resonator may include an outer contact region comprising a first-type doping and disposed annularly and at least partially surrounding an outer annular surface of the waveguide base. Furthermore, the ring resonator may include an inner contact region comprising a second-type doping and disposed annularly contacting an inner annular surface of the waveguide base. Moreover, the ring resonator may include an annular detector region disposed annularly at a distance from and covering at least a portion of a surface of the waveguide core and contacting the outer contact region.

20 Claims, 10 Drawing Sheets

(56) References Cited

OTHER PUBLICATIONS

Dey et al., "Demonstration of a Wavelength Monitor Comprised of Racetrack-Ring Resonators with Defect Mediated Photodiodes Operating in the C-Band", Optics express, vol. 21, No. 20, 2013, pp. 23450-23458.

Li et al., "Optical Power Monitoring with Ultrahigh Sensitivity in Silicon Waveguides and Ring Resonators", IEEE Photonics Journal, vol. 9, No. 5, Oct. 2017, 11 pages.

Ahn, D., et al.; "High performance, waveguide integrated Ge photodetectors"; Mar. 15, 2007; 9 pages.

Chen, L., et al.; "Ultra-low capacitance and high speed germanium photodetectors on silicon"; Jun. 2009; 10 pages.

Vivien, L., et al.; "High speed and high responsivity germanium photodetector integrated in a Silicon-On-Insulator microwaveguide"; Aug. 2007; 10 pages.

* cited by examiner

US 11,886,020 B2

RING RESONATOR WITH INTEGRATED DETECTOR FOR MONITORING LIGHT COMPRISING AN ANNULAR DETECTION REGION THAT IS PHYSICALLY ISOLATED FROM A WAVEGUIDE CORE

STATEMENT OF GOVERNMENT RIGHTS

This invention was made with Government support under Award No. DE-AR0001039 awarded by DOE, Office of ARPA-E. The Government has certain rights in this invention.

BACKGROUND

Optical communication systems provide communication over longer distances with higher bandwidth using smaller cable width (or diameter) in comparison to communication systems using electrical wires. In an optical communication system, a light may be modulated by an optical transmitter and demodulated by an optical receiver that includes photosensitive devices, for example. Also, certain optical systems include use of optical ring resonators to implement optical modulators, a ring laser, or a ring filter.

BRIEF DESCRIPTION OF THE DRAWINGS

Various examples will be described below with references to the following figures.

Figure 1A:
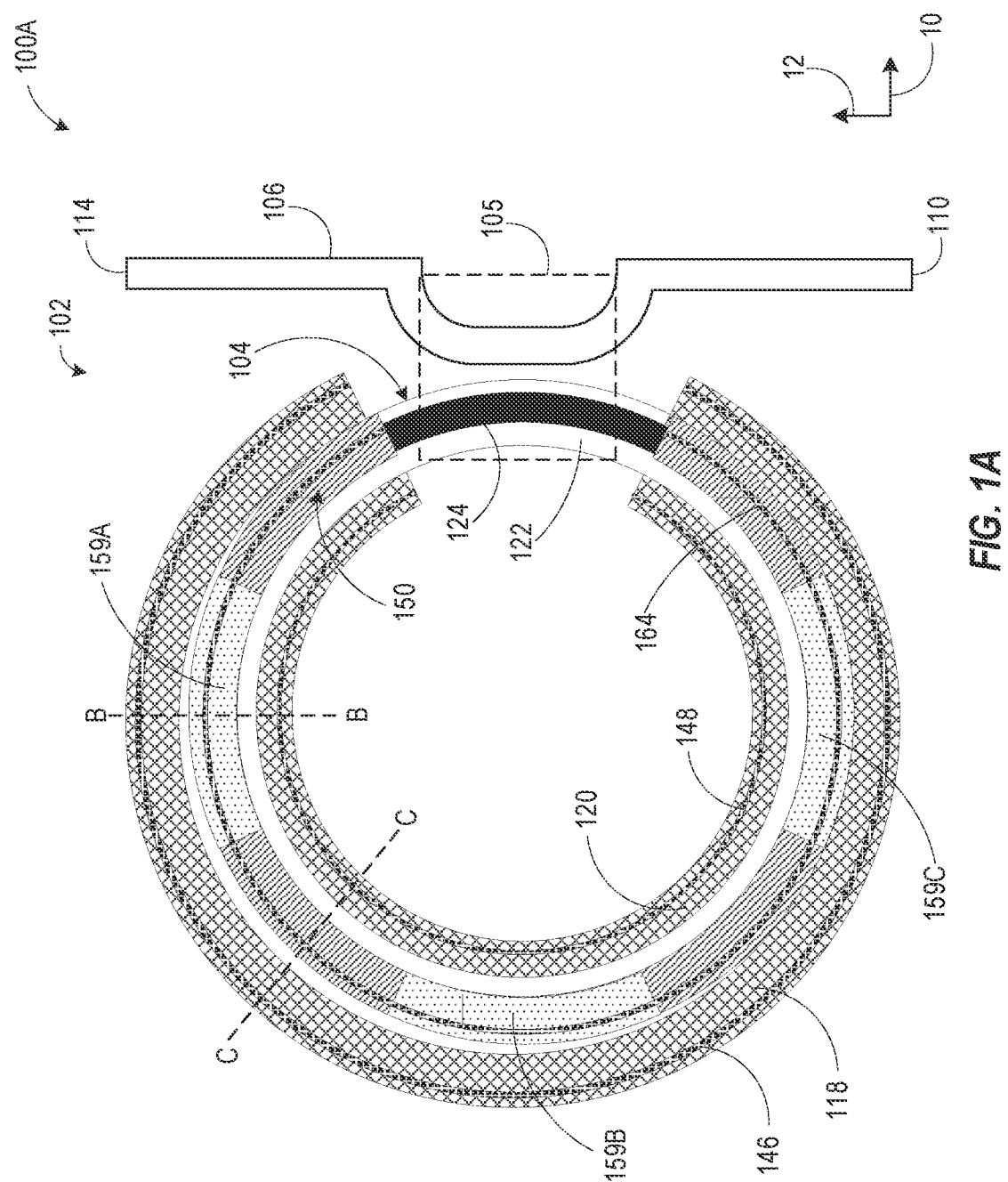
FIG. 1A depicts a top view of a ring resonator, in accordance with an example.

It is emphasized that, in the drawings, various features are not drawn to scale. In fact, in the drawings, the dimensions of the various features have been arbitrarily increased or reduced for clarity of discussion.

DETAILED DESCRIPTION

The following detailed description refers to the accompanying drawings. Wherever possible, same reference numbers are used in the drawings and the following description to refer to the same or similar parts. It is to be expressly understood that the drawings are for the purpose of illustration and description only. While several examples are described in this document, modifications, adaptations, and other implementations are possible. Accordingly, the following detailed description does not limit disclosed examples. Instead, the proper scope of the disclosed examples may be defined by the appended claims.

Ring resonators are widely used as components in various applications such as modulators, lasers, or filters. Typically, the resonator includes an annular waveguide and a coupling waveguide disposed adjacent to, and evanescently coupled to, the annular waveguide. At resonant wavelengths, the optical signal in the annular waveguide interferes constructively. A resonant wavelength of a ring resonator is a function of an effective refractive index. Accordingly, a desired resonant wavelength may be achieved by tuning the effective refractive index which is a temperature-dependent parameter. Therefore, in some known implementations, the resonant wavelength may be tuned via thermal tuning mechanisms, for example, via resistive heating techniques while monitoring a resonant wavelength of the ring resonator. Systems to monitor the resonant wavelength commonly use a drop port that is optically coupled to the ring resonator to obtain, at the drop port, at least a portion of the optical signal being transmitted in the annular waveguide. In certain traditional implementations, a drop bus waveguide including one or more drop ports is optically coupled to the ring resonator such that at least a portion of the optical signal being transmitted in the annular waveguide is received at the drop port. One or more photodiodes (PDs) are installed at the drop port to aid in the monitoring of the optical signal received at the drop port.

Use of additional structural elements such as the drop bus waveguide with one or more drop ports and corresponding one or more PDs require additional space leading to an increase in overall footprint of the ring resonator or require compromise on internal structure and/or efficiency of the ring resonator. For example, to save space for the drop bus waveguide in a ring modulator, an effective doping region is reduced. Such compromise in the effective doping region leads to the formation of the ring modulator with reduced modulation efficiency. Further, the drop port partly transmits light out of the ring resonator, which introduces extra power loss and thus reduces the Q-factor of the ring resonator.

In some examples, the described ring resonator includes an annular waveguide formed from a first semiconductor material. The annular waveguide may include a waveguide base and a waveguide core that is narrower than the base. The ring resonator may include an outer contact region having a first-type doping and disposed annularly outside of an outer annular surface of the waveguide base. Furthermore, the ring resonator may include an inner contact region having a second-type doping and disposed annularly contacting an inner annular surface of the waveguide base. The ring resonator may further include an annular detector region formed of a second semiconductor material and disposed annularly at a distance from and covering at least a portion of a surface of the waveguide core and contacting the outer contact region.

During the operation of a ring resonator, some amount of light may leak from the outer annular surface of the waveguide core due to the curvature of the annular waveguide. This light leakage is sometimes referred to as a radiation mode or unbound mode. In particular, for an optical fiber or a waveguide, a mode (e.g., light) that is not confined by a fiber core or a waveguide core may be referred to as the radiation mode or the unbound mode.

In one example, the annular detector region is disposed in contact with both the outer contact region and the inner contact region, which creates a photo-sensitive junction. For example, a P-I-N junction may be formed due to a series connection of the inner contact region (e.g., having P-type doping), the annular detector region (e.g., an intrinsic region), and the outer contact region (e.g., having N-type doping). During operation, a reverse bias voltage may be applied across the outer contact region and the inner contact region to cause the P-I-N junction to operate as a photodiode (PD).

The annular detector region at least partially surrounds an outer annular surface of the waveguide core. In such a structure, the ring resonator may include an intermediate contact region formed on top of the annular detector region and having the second-type doping. The intermediate contact region may be disposed annularly contacting the annular detector region which creates a photo-sensitive junction. For example, a P-I-N junction may be formed due to a series connection of the intermediate contact region (e.g., having P-type doping), the annular detector region (e.g., an intrinsic region), and the outer contact region (e.g., having N-type doping). During operation, a reverse bias voltage may be applied across the intermediate contact region and the outer contact region to cause the P-I-N junction to operate as a PD.

A structure (e.g., the P-I-N junction) forming the PD may be integrated within the ring resonator. As will be described in greater detail hereinafter, such a PD integrated within the ring resonator may be used to monitor light leakage (e.g., radiation modes) from the annular waveguide. As the structure forming the PD is integrated within the ring resonator, additional structures such as a drop bus waveguide with one or more drop ports may be avoided resulting in an overall compact footprint of the proposed ring resonator. Moreover, in some examples, the annular detector region forming the PD may be directly grown on the top of the annular waveguide. Such reuse of the effective area saves space and enabling more efficiently integrated ring resonators. Further, such an integrated PD may enable techniques such as wavelength locking in ring lasers, modulators, and filters, which may be beneficial in applications such as wavelength division multiplexing (WDM).

The annular detector region is formed at a distance from the waveguide core such that the PD in the ring resonator absorbs a portion of the radiation mode without impacting the confined mode(s). Due to the curvature of the annular waveguide, light leaks mainly from the outer surface of the waveguide core. As the annular detector region at least partially surrounds the outer annular surface of the waveguide core, the integrated PD can absorb light leaking from the annular waveguide. As PD doesn't affect the light inside the waveguide core, the Q-factor of the ring resonator may be higher than that of a similar resonator using a drop filter.

In some examples, an isolation spacer may be disposed between the annular detector region and the waveguide core that physically separates the PD from the waveguide core. As will be appreciated, characteristics such as thickness and composition of the isolation spacer may be selected according to overall performance (e.g., the Q-factor and/or the efficiency) of the PD and the ring resonator.

Figure 1B:
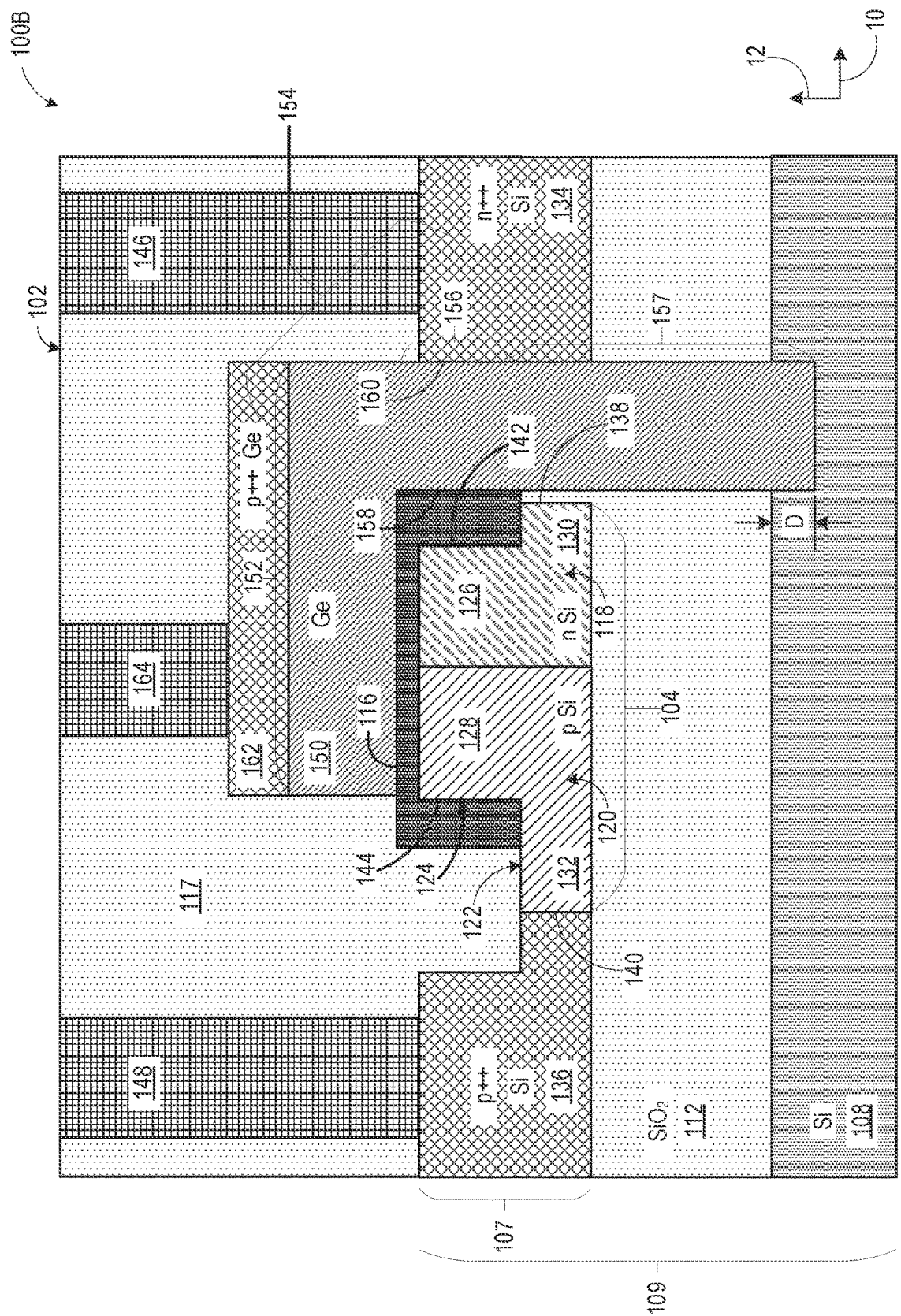
FIG. 1B depicts a cross-sectional view of the ring resonator at a first location depicted in FIG. 1A, in accordance with an example.
Figure 1C:
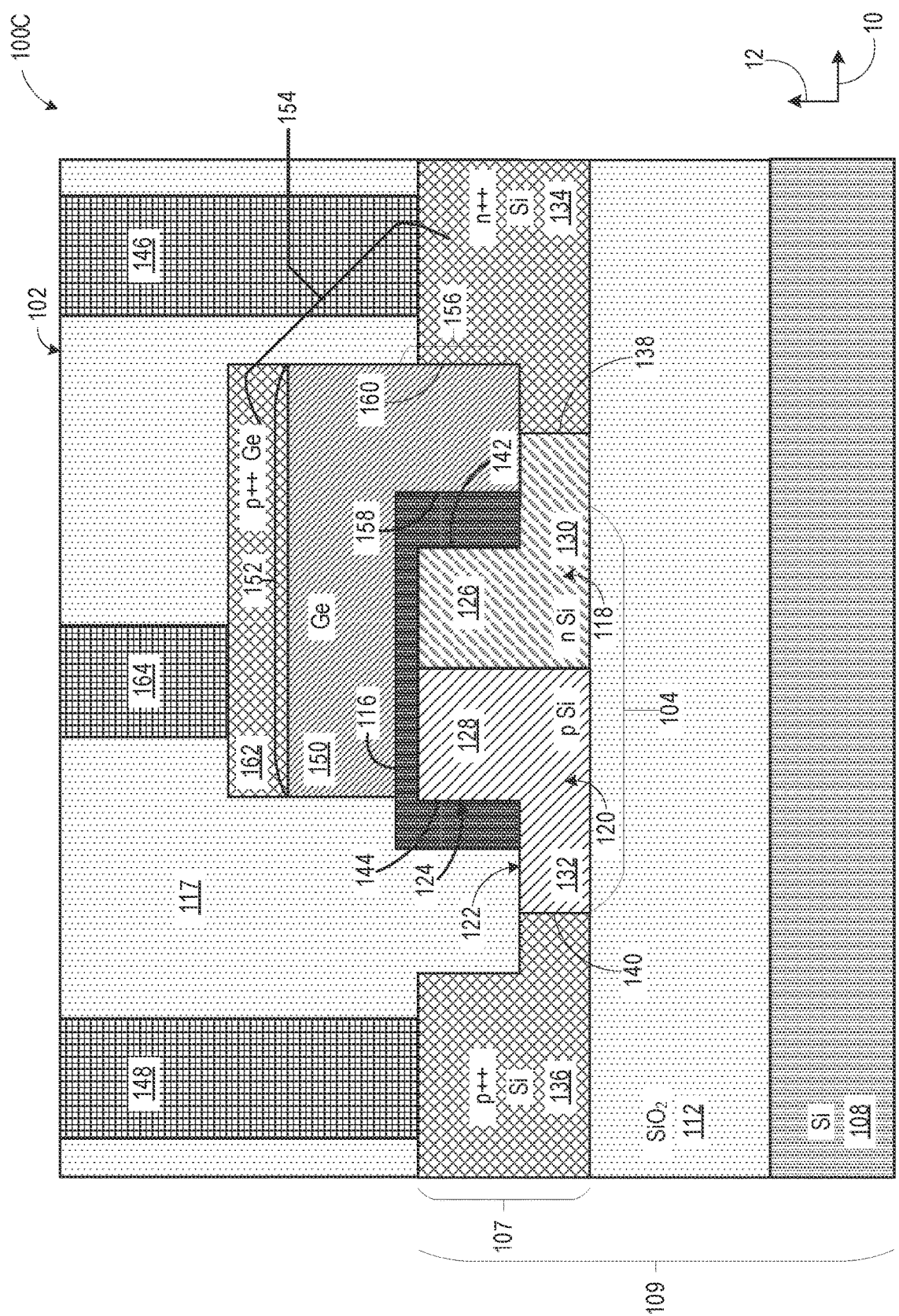
FIG. 1C depicts a cross-sectional view of the ring resonator at a second location depicted in FIG. 1A, in accordance with an example.

Referring now to the drawings, FIG. 1A depicts a top view 100A of an example ring resonator; FIG. 1B depicts a cross-sectional view 100B taken at location B-B; and FIG. 1C depicts a cross-sectional view 100C taken at a location C-C. In FIGS. 1B-1C, arrows 10 and 12 show a radial direction and a vertical direction ("radial direction 10" and "vertical direction 12"). For clarity of representation, certain regions/layers of the ring resonator 102 are not shown in the top view 100A of FIG. 1A.

The ring resonator 102 may be a semiconductor-based optical micro-ring device suitable for several applications such as a ring modulator, a ring laser, and a ring filter. The ring resonator 102 may include an annular waveguide 104 and an optical coupling waveguide 106 (also referred to as a coupling waveguide 106) disposed sufficiently close to the annular waveguide 104 to provide evanescent coupling through coupling region 105. The coupling waveguide 106 may include an input port 110 and an output port 114. An optical signal may be supplied to the ring resonator 102 via the input port 110 and signal having a wavelength equal to a resonant wavelength of the annular waveguide 104 may be coupled into (e.g., trapped inside) the annular waveguide 104.

Turning now to FIGS. 1B-1C, in some examples, one or both of the annular waveguide 104 and the coupling waveguide 106 may be formed on a substrate 108. The substrate 108 may be made of one or more semiconductor materials including, but not limited to, silicon (Si), indium phosphide (InP), germanium (Ge), gallium arsenide (GaAs), silicon carbide (SiC), aluminum gallium arsenide (AlGaAs), indium gallium arsenide (InGaAs), indium arsenide (InAs). For ease of explanation, the substrate 108 is described as made of Si. Further, in some examples, the ring resonator 102 may include a base oxide layer 112 disposed over the substrate 108. The base oxide layer 112 may be formed by oxidizing the substrate 108. For example, with a silicon substrate 108, the base oxide layer 112 may be silicon dioxide ($SiO_2$) (which may be formed in the presence of oxygen at a temperature in the range from 900° C. to 1380° C.). In some examples, the base oxide layer 112 may be a buried oxide (BOX) layer in the substrate 108. For example and depending on the application, a layer of the $SiO_2$ may be buried in the substrate 108 at a depth from the wafer surface ranging from less than 100 nm to several micrometers.

The annular waveguide 104 may be formed on the base oxide layer 112 above the substrate 108. Examples of the first semiconductor material used to form the annular waveguide 104 may include, but are not limited to, Si, InP, Ge, GaAs, SiC, AlGaAs, or combinations thereof. For illustration purposes, in FIG. 1B, the annular waveguide 104 is similarly described as composed of silicon. Also, for illustration purposes, the annular waveguide 104 is shown to have a ring shape. In some examples, the annular waveguide 104 may have any other shapes, for example, a loop of any shape (e.g., circular loop, oval loop, rounded rectangle loop, rounded square loop, rounded triangle loop, etc.). By way of example, the annular waveguide may have an elongated loop shape (e.g., a racetrack shape).

The annular waveguide 104 may include an outer annular region 118 and an inner annular region 120. The outer annular region 118 may be adjacent to the inner annular region 120 outwardly in radial direction 10. Both the outer annular region 118 and the inner annular region 120 may be formed of the same material (e.g., Si), but may be differently doped. For example, the outer annular region 118 may include a first-type of doping and the inner annular region 120 may include a different second-type of doping. For illustration purposes, the first-type doping is described as N-type and the second-type doping is described as P-type. In other examples, the first-type doping may be P-type and the second-type doping may be N-type. For illustration purposes, the outer annular region 118 is shown to include the first-type (i.e., N-type) doping, and the inner annular region 120 is to include the second-type (i.e., P-type) doping.

In some examples, the annular waveguide 104 may be shaped to have a waveguide base 122 and a waveguide core 124 that is narrower than the waveguide base 122. The outer annular region 118 and the inner annular region 120 are shaped accordingly to the desired overall shape of the waveguide 104. For example, the outer annular region 118 may have an L-shaped cross-section (see FIG. 1B). In this example, the inner annular region 120 may have a mirrored L-shaped cross-section. In particular, the waveguide core 124 may include the combined region formed by upper regions 126, 128 of the annular regions 118, 120, respectively. Similarly, the waveguide base 122 may include the combined region formed by lower regions 130, 132 of the annular regions 118, 120, respectively. Because the upper regions 126, 128 are thinner than the lower regions 130,132, the waveguide core 124 is narrower than the waveguide base 122. Accordingly, the confined mode may be located mainly within the waveguide core 124.

Furthermore, in some examples, the ring resonator 102 may include one or more contact regions, for example, an outer contact region 134 and an inner contact region 136 (hereinafter collectively referred to as contact regions 134 and 136). For illustration purposes, in FIG. 1B, the contact regions 134 and 136 are shown as made of Si. In some other examples, the contact regions 134 and 136 may be made of other semiconductor materials such as InP, Ge, GaAs, SiC, AlGaAs, or combinations thereof. The contact regions 134 and 136 may be formed radially on the inner and outer sides of the annular waveguide 104. As such, the annular waveguide 104 may be radially sandwiched between the outer contact region 134 and the inner contact region 136. In one example, the annular waveguide 104 and the contact regions 134 and 136 may be formed in a foundation semiconductor layer 107. In particular, the annular waveguide 104 and the contact regions 134 and 136 may be formed by suitably shaping (e.g., etching) the foundation semiconductor layer 107 and performing impurity doping as indicated with reference to each of the annular waveguide 104 and the contact regions 134 and 136. In one implementation, the foundation semiconductor layer 107, the base oxide layer 112, and the substrate 108 may form a wafer 109 (i.e., a silicon-on-insulator (SOI) wafer).

The vertically oriented annular surface 138 of the waveguide base 122 (also referred to as outer annular surface 138) faces the outer contact region 134. In particular, the outer annular surface 138 may be the surface of the lower region 130 opposite to the surface of the outer annular region 118 that contacts the lower region 132. Further, a vertically oriented annular surface 140 of the waveguide base 122 (also referred to as inner annular surface 140) faces the inner contact region 136. In particular, the inner annular surface 140 may be the surface of the lower region 132 opposite to the surface of the inner annular region 120 that contacts the lower region 130.

Moreover, a vertically oriented annular surface 142 of the waveguide core 124 (also referred to as outer annular surface 142) faces the outer contact region 134. In particular, the outer annular surface 142 may be the surface of the upper region 126 opposite to the surface of the outer annular region 118 that contacts the upper region 128 of the inner annular region 120. Further, a vertically oriented annular surface 144 of the waveguide core 124 (also referred to as inner annular surface 144) faces the inner contact region 136. In particular, the inner annular surface 144 may be the surface of the upper region 128 opposite to the surface of the inner annular region 120 that contacts the upper region 126 of the outer annular region 118.

Referring now to contact regions 134 and 136, the outer contact region 134 may be formed annularly and at least partially surrounding the outer annular surface 138 of the waveguide base 122. In particular, in the example implementation of the ring resonator 102 depicted in FIG. 1B, the outer contact region 134 is spaced apart (see FIG. 1B) from the outer annular region 118 of the annular waveguide 104 at one or more locations along the periphery of the annular waveguide 104. At certain other locations along the periphery of the annular waveguide 104, the outer contact region 134 may contact the outer annular region 118 (see FIG. 1C). In other examples, the outer contact region 134 may be formed such that the outer contact region 134 is disposed in continuous annular contact with the outer annular region 118 of the annular waveguide 104 (see, FIGS. 3A and 4A). Moreover, in some examples, the inner contact region 136 may be formed annularly contacting the inner annular surface 140 of the waveguide base 122.

In some examples, the outer contact region 134 may include the first-type doping and the inner contact region 136 may include the second-type doping. For illustration purposes, the first-type doping is described as N-type doping and the second-type doping is described as P-type doping. Accordingly, in the example of FIG. 1B, the outer contact region 134 is shown to include the N-type doping, and the inner contact region 136 is shown to include the P-type doping. In some examples, the inner contact region 136 may have a higher concentration of respective doping in comparison to a doping concentration in the outer annular region 118 and the inner annular region 120. Accordingly, the outer contact region 134 and the inner contact region 136 may be highly doped and are marked with labels "n++" and "p++," respectively. In some examples, the outer annular region 118 and the inner annular region 120 may not be highly doped and are marked with "n" and "p," respectively. Accordingly, the outer annular region 118 and the inner annular region 120 may be referred to as lightly doped regions.

Furthermore, in some examples, an isolation spacer 116 may be disposed over the annular waveguide 104. In particular, the isolation spacer 116 is formed over a surface (e.g., the top surface, the outer annular surface 142, and the inner annular surface 144) of the waveguide core 124. The isolation spacer 116 may be composed of materials such as $SiO_2$, Silicon Nitride ($Si_3N_4$), Aluminum oxide ($Al_2O_3$), Hafnium Dioxide ($HfO_2$), or polyimide, benzocyclobutene (BCB). An annular detector region 150 is formed over the isolation spacer 116. Additional details about the isolation spacer 116 and the annular detector region 150 are provided below. Also, in some examples, an electrically insulating layer 117 may be formed over exposed portions of the annular waveguide 104, the contact regions 134, 136, and the annular detector region 150. Examples of the electrically insulating layer 117 may include $SiO_2$, $Si_3N_4$, $Al_2O_3$, $HfO_2$, polyimide, BCB, or the like.

Moreover, in some examples, the ring resonator 102 may include metal contacts, such as, a first metal contact 146 and a second metal contact 148 (metal contacts 146 and 148). As depicted in FIG. 1B, the first metal contact 146 and the second metal contact 148 are electrically coupled (e.g., in direct physical contact or via any intermediate electrically conductive material) to the outer contact region 134 and the inner contact region 136, respectively. In some examples, the metal contacts 146 and 148 are on top of (i.e., vertically over) the outer contact region 134 and the inner contact region 136, respectively. To form the metal contacts 146, 148, the electrically insulating layer 117 may be etched or lithographically defined to form respective vias until the outer contact region 134 and the inner contact region 136 are reached. Once the vias are formed, a conducting material (e.g., metal) is filled into the vias to form the metal contacts 146 and 148. Examples of materials used to form the metal contacts 146, 148 may include, but are not limited to, Copper (Cu), Gold (Au), Al, Platinum (Pt), and the like.

In some examples, the ring resonator 102 may be operated in a depletion mode by applying a first reverse bias voltage across the outer contact region 134 and the inner contact region 136 via the first metal contact 146 and the second metal contact 148, respectively. When the first reverse bias voltage is applied across the outer contact region 134 and the inner contact region 136, a depletion region between the outer annular region 118 and the inner annular region 120 may increase in size due to a reduction in the charge carrier concentration near a junction between the outer annular region 118 and the inner annular region 120. The reduction in the charge carrier concentration may cause an increase in the refractive index of the annular waveguide 104. In particular, upon application of the first reverse bias voltage, the refractive index within the waveguide core 124 may increase in comparison to the rest of the structure of the ring resonator 102. Consequently, the optical signal may be mostly confined within the annular waveguide 104, in particular, in the waveguide core 124. In some examples, the ring resonator 102 may be operated as a ring modulator if the first reverse bias voltage applied across the contact regions 134, 136 is modulated by a modulating signal. In particular, when the first reverse bias voltage is modulated, the refractive index within the waveguide core 124 may vary in accordance with the modulating signal and a modulated light output may be collected at the output port 114.

In some examples, the ring resonator 102 may include an annular detector region 150 that forms a photosensitive element (i.e., a photodiode) in conjunction with one or more of the outer contact region 134, the inner contact region 136, or any additional contact region (described below). This photodiode collects the leakage from the annular waveguide 104 without affecting the light confined inside. The light leakage from the annular waveguide 104 may be proportional to the light confined in the annular waveguide 104. Accordingly, the current generated by the photodiode measures the level of optical power confined inside the annular waveguide 104.

The annular detector region 150 may be disposed annularly at a distance from the waveguide core 124. The annular detector region 150 may surround at least a portion of a surface of the waveguide core 124 and contact the outer contact region 134. In some examples, the annular detector region 150 may be formed of the second semiconductor material. For example, the second semiconductor material may include, but are not limited to, Si, InP, Ge, GaAs, AlGaAs, InGaAs, InAs, or combinations thereof. The second semiconductor material may be different from the first semiconductor material. In some examples, in the annular detector region 150, the second semiconductor material may be in its intrinsic form. For illustration purposes, the annular detector region 150 is sown as intrinsic Ge. In certain other examples, the annular detector region 150 may be formed of a lightly doped (e.g., unintentionally doped) second semiconductor material and include the first-type doping.

The annular detector region 150 may cover at least a portion of a surface of the waveguide core 124 and is physically isolated from the annular waveguide 104. The annular detector region 150 may be formed of a shape that can annularly cover at least a portion of the outer annular surface 142 of the waveguide core 124. As previously noted, the light leaks mainly from the outer annular surface 142 of the waveguide core 124 due to the curvature of the annular waveguide 104. Accordingly, so long as the annular detector region 150 is shaped to at least partially cover the outer annular surface 142 of the waveguide core 124, the annular detector region 150 will be able to absorb at least a portion of the light leaking from the annular waveguide 104 during operation.

Accordingly, in some examples, the annular detector region 150 may have an inverted L-shaped cross-section (e.g., a shape achieved by rotating an L shape 180°), as depicted in FIG. 1B. In the example implementation depicted in FIG. 1B, annular detector region 150 is shown to have a radial region 152 (oriented along the radial direction 10), a vertical region 156 (oriented along the vertical direction 12), and an extension finger 157. The radial region 152 and the vertical region 156 form an annular structure. The radial region 152 may be formed on top of the waveguide core 124. In the example of FIG. 1B, although the radial region 152 is shown as formed along the full width of the waveguide core 124, the radial region 152 may be shorter (or even nonexistent). For example, the annular detector region 150 may include only the vertical region 156 to absorb at least a portion of the light leaking from the outer annular surface 142 of the waveguide core 124.

Further, in some examples, the vertical region 156 may be formed along at least a portion of the height of the annular waveguide 104 and at a distance from the annular waveguide 104 but contacting the outer contact region 134. In particular, an inner annular surface 158 of the vertical region 156 is disposed at a distance from the annular waveguide 104 and at least a portion of an outer annular surface 160 of the vertical region 156 may annularly contact the outer contact region 134. Further, in some examples, an extension finger 157 may be formed at one or more locations along the periphery of the annular detector region 150. In an example implementation depicted in the top view 100A, the annular detector region 150 may include extension fingers 157 in a plurality of regions 159A, 159B, 159C shown along the annulus of the annular detector region 150. As such, the cross-sectional view 100B represents the cross-section of the ring resonator 102 at the location B-B within the region 159A having the extension finger 157. On the other hand, the cross-sectional view 100C represents a cross-section of the ring resonator 102 at the location C-C that does not include the extension fingers 157. Accordingly, at such location C-C, the outer contact region 134 may contact the annular waveguide 104, thereby supplying the first reverse bias voltage to the annular waveguide 104 during the operation. In particular, the location C-C (or any other location where the extension fingers 157 are not present), the outer contact region 134 may contact the outer annular surface 138 of the waveguide base 122. Further, it is to be noted that, although the annular detector region 150 is described as including the extension fingers 157 in three regions 159A, 159B, 159C, the annular detector region 150 may include the extension fingers 157 at more or fewer regions than shown.

In some examples, the extension fingers 157 may extend from the vertical region 156 through the base oxide layer 112 and contact the substrate 108. In certain examples, as depicted in FIG. 1B, the extension fingers 157 may extend through the base oxide layer 112 up to a predetermined depth "D" into the substrate 108 as depicted in FIG. 1B.

In some examples, the annular detector region 150 may be separated from the waveguide core 124 via the isolation spacer 116. As previously noted, the isolation spacer 116 may be formed along the surface (e.g., the top surface, the outer annular surface 142, and the inner annular surface 144) of the waveguide core 124. In some examples, the thickness of the isolation spacer 116 may be sufficient to allow leakage light to pass there-through. In certain examples, the thickness of the oxide layer is in a range from 10 nanometers (nm) to 500 nm.

Moreover, in some examples, the ring resonator 102 may include an intermediate contact region 162 disposed on top of the annular detector region 150 and annularly contacting the annular detector region 150. The intermediate contact region 162 may include the second-type doping similar to the doping in the inner contact region 136. By way of example, the intermediate contact region 162 may be a heavily doped Si region. Also, in some examples, the ring resonator 102 may include a third metal contact 164 that is similar to any of the metal contacts 146, 148 and may be formed in a similar manner as the metal contacts 146, 148 are formed.

As depicted in the example implementation of the ring resonator 102 shown in FIG. 1B, the intermediate contact region 162, the annular detector region 150, and the outer contact region 134 are physically coupled to each other in series. Such a series connection of the intermediate contact region 162, the annular detector region 150, and the outer contact region 134 forms a photosensitive junction, for example, a P-I-N junction. During operation, a second reverse bias voltage may be applied across the intermediate contact region 162 and the outer contact region 134 via the third metal contact 164 and the first metal contact 146, respectively. Such application of the second reverse bias voltage across the intermediate contact region 162 and the outer contact region 134, may cause the P-I-N junction to operate as a photodiode (PD). Accordingly, a structure represented by the combination of the intermediate contact region 162, the annular detector region 150, and the outer contact region 134 is hereinafter referred to as a PD 154.

The PD 154 may be operated, by applying the second reverse bias voltage across the intermediate contact region 162 and the outer contact region 134, to generate electric current depending on a light impinging thereon. Upon application of the second reverse bias voltage, the annular detector region 150 generates electron-hole pairs (e.g., free charge carriers) when the light leaking from the waveguide core 124 impinges on the PD 154 (in particular, on the annular detector region 150). Such generation of the electron-hole pairs constitutes the generation of electric current by the PD 154. The magnitude of the electric current is proportional to the amount of the leakage light impinging on the annular detector region 150.

Figure 2:
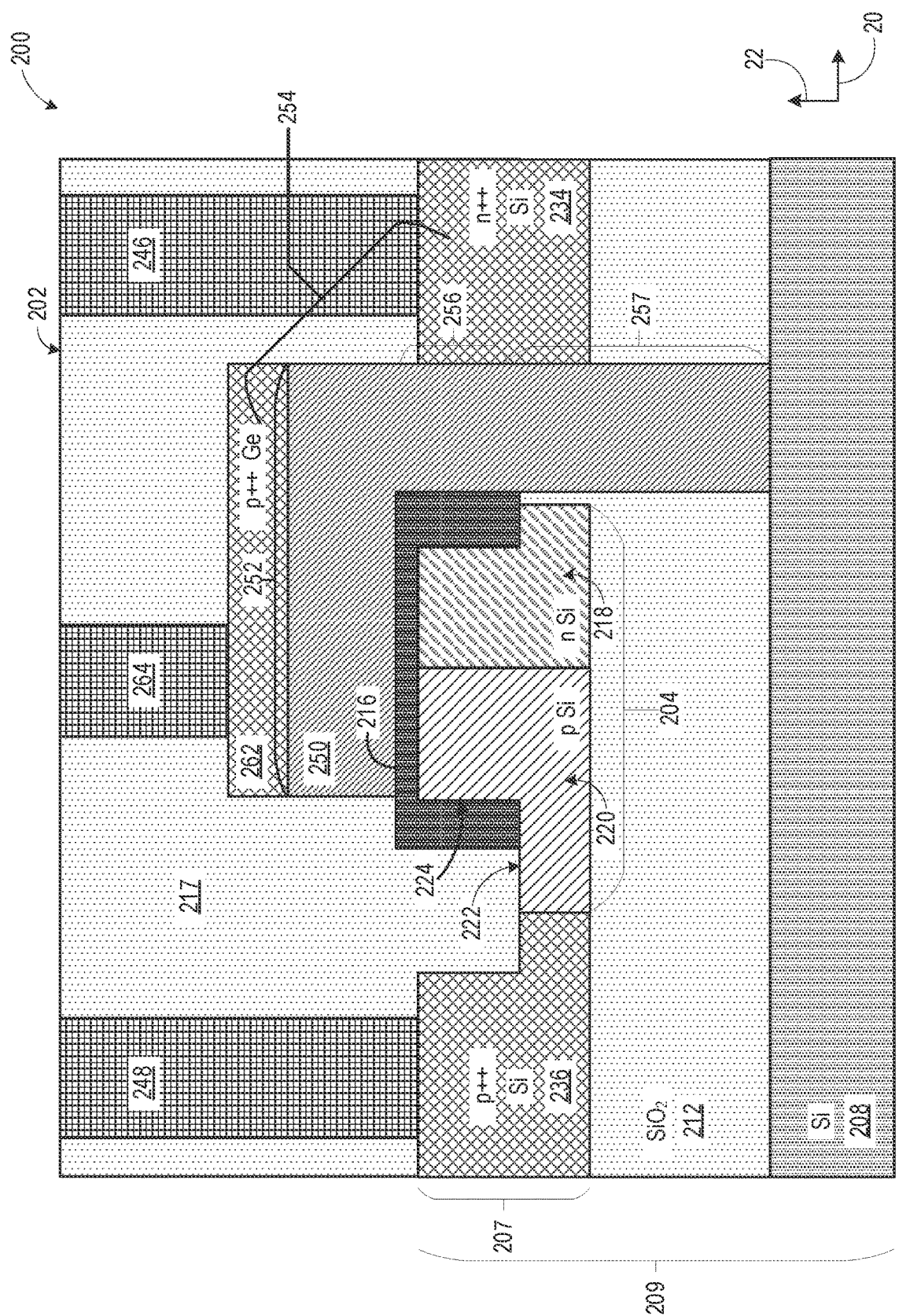
FIG. 2 depicts a cross-sectional view of a ring resonator, in accordance with another example.

Referring now to FIG. 2, a cross-sectional view 200 of a ring resonator 202 is depicted, in accordance with another example. In FIG. 2, arrows 20 and 22 show a radial direction (radial direction 20) and a vertical direction (vertical direction 22), respectively. The ring resonator 202 depicted in FIG. 2 may be representative of one example of the ring resonator 102 depicted in FIGS. 1A-1C. Accordingly, the ring resonator 202 may include certain features that are similar, in one or more aspects (e.g., geometry, dimension, positioning, material properties, or operation), with similarly named features of the ring resonator 102, description of which is not repeated herein for the sake of brevity.

For example, the ring resonator 202 may include a wafer 209 having a substrate 208, a base oxide layer 212, and a foundation semiconductor layer 207. Further, the ring resonator 202 may include an annular waveguide 204 having an outer annular region 218 and an inner annular region 220; an outer contact region 234; and an inner contact region 236 formed in the foundation semiconductor layer 207. The annular waveguide 204 may have a waveguide core 224 and a waveguide base 222 defined by the outer annular region 218 and an inner annular region 220. Furthermore, the ring resonator 202 may include an isolation spacer 216, an insulating layer 217, an intermediate contact region 262, metal contacts 246, 248, 264, and an annular detector region 250. A structure represented by the combination of the intermediate contact region 262, the annular detector region 250, and the outer contact region 234 is referred to as a PD 254.

The annular detector region 250 is shaped differently than the annular detector region 150 of FIGS. 1A-1C. In particular, the annular detector region 250 may include a radial region 252, a vertical region 256 extending from the radial region 252, and an extension finger 257 extending from the vertical region 256. In particular, the extension finger 257 of the annular detector region 250 may extend through the base oxide layer 212 and contact the substrate 208.

Figure 3A:
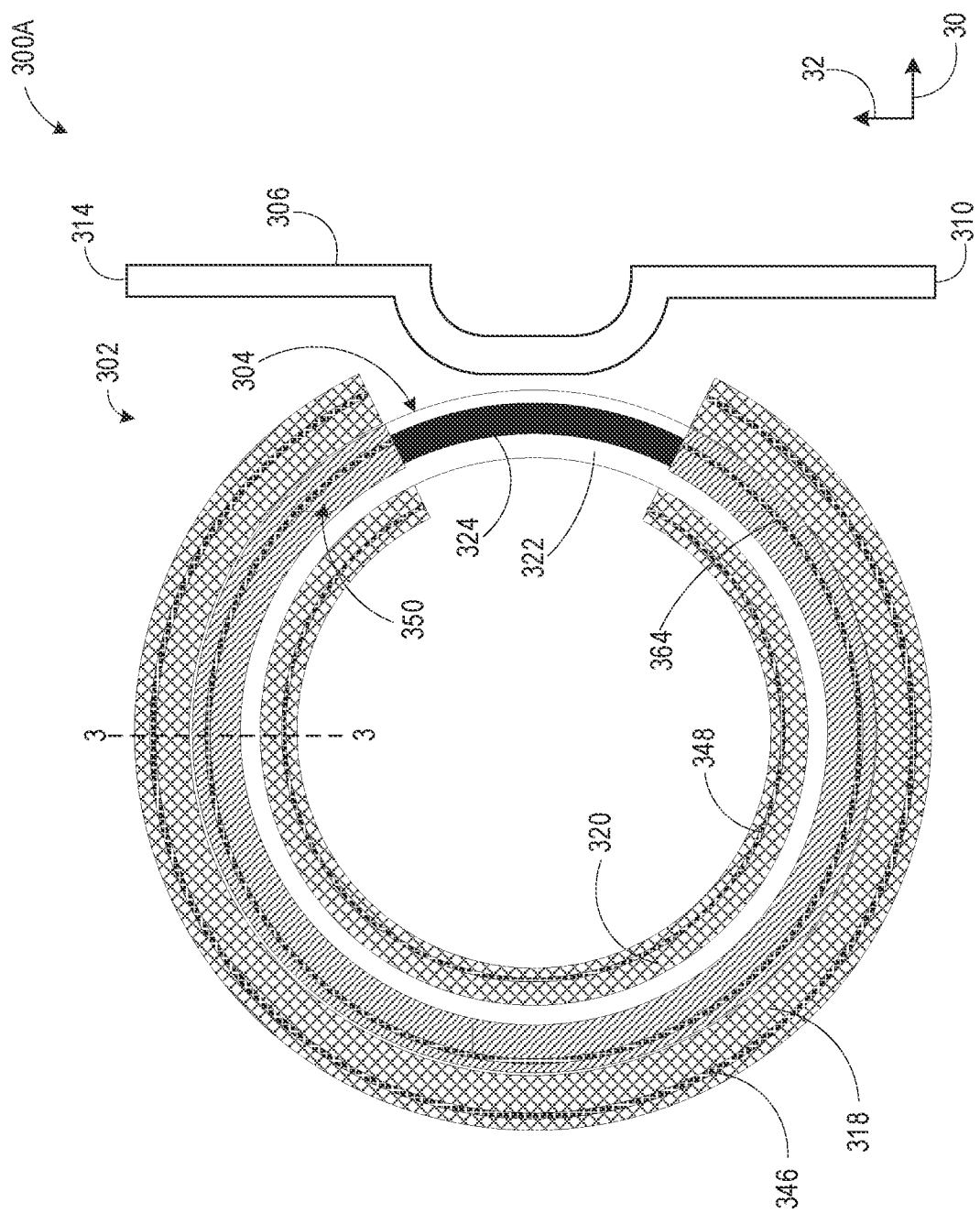
FIG. 3A depicts a top view of a ring resonator, in accordance with another example.
Figure 3B:
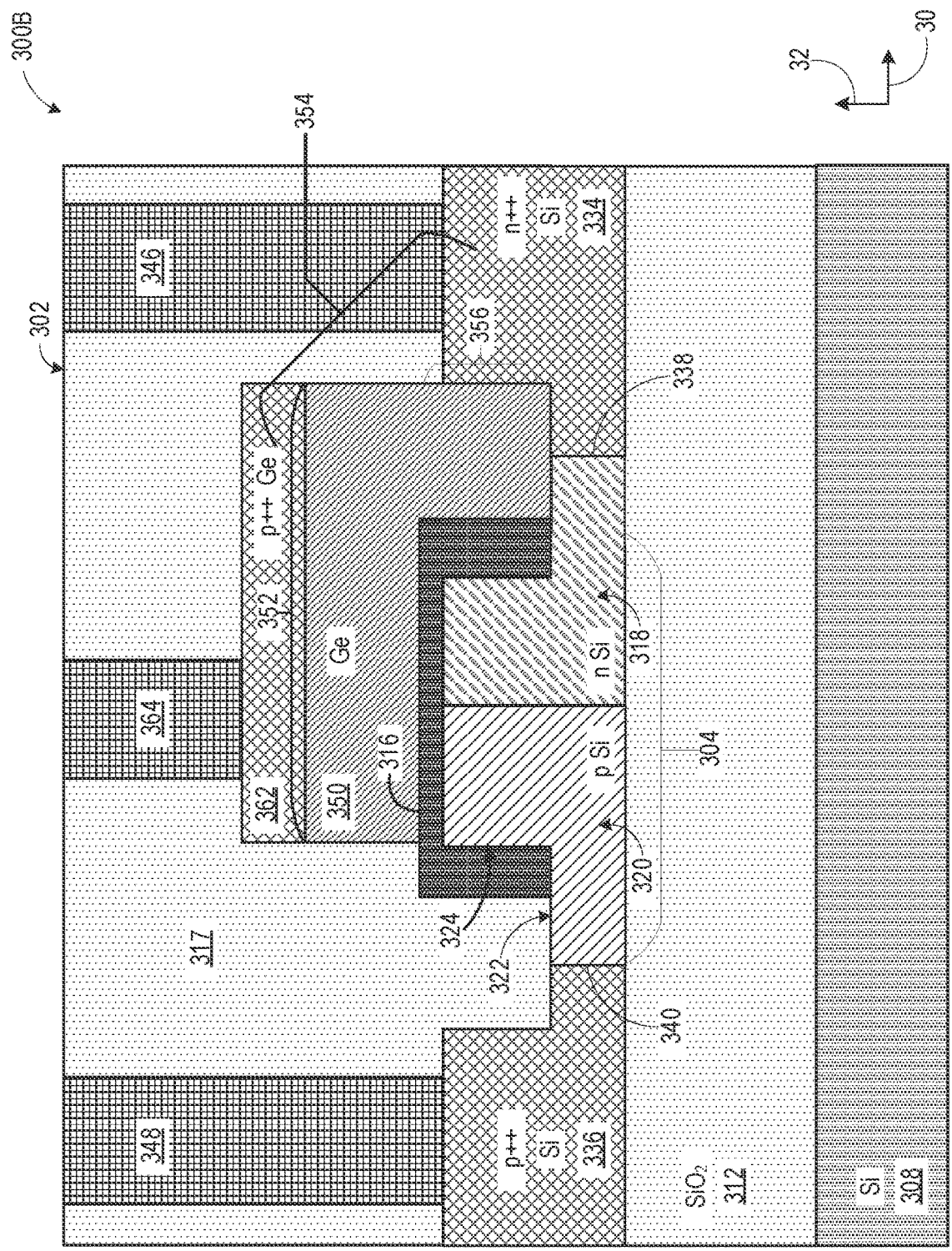
FIG. 3B depicts a cross-sectional view of the ring resonator of FIG. 3A, in accordance with another example.

Referring now to FIGS. 3A and 3B, in FIG. 3A depicts a top view 300A of an example ring resonator 302. FIG. 3B depicts a cross-sectional view 300B of the example ring resonator 302 taken at location 3-3 marked in FIG. 3A. For clarity of representation, certain regions/layers of the ring resonator 302 are not shown in the top view 300A of FIG. 3A. In FIGS. 3A-3B, arrows 30 and 32 show a radial direction (radial direction 30) and a vertical direction (vertical direction 32), respectively. The ring resonator 302 depicted in FIGS. 3A-3B may be representative of one example of the ring resonator 102 depicted in FIGS. 1A-1C. Accordingly, the ring resonator 302 may include certain features that are similar to those described with respect to the ring resonator 102, a description of which is not repeated herein for the sake of brevity.

The ring resonator 302 may include an annular waveguide 304, a coupling waveguide 306, a substrate 308, a base oxide layer 312, an isolation spacer 316, an electrically insulating layer 317, an outer contact region 334, an inner contact region 336, an intermediate contact region 362, a first metal contact 346, a second metal contact 348, a third metal contact 364, and an annular detector region 350 that are similar, in one or more aspects (e.g., geometry, dimension, positioning, material properties, or operation), with similarly named features of the ring resonator 102. Further, the annular waveguide 304 may include an outer annular region 318 and an inner annular region 320, which are similar, in one or more aspects, to the outer annular region 118 and an inner annular region 120, respectively, of the annular waveguide 104. Further, the coupling waveguide 306 may have an input port 310 and an output port 314, which are similar, in one or more aspects, to the input port 110 and the output port 114, respectively, of the coupling waveguide 106. Similar to the annular waveguide 104, the annular waveguide 304 may also be operated by applying a first reverse bias voltage across the outer contact region 334 and the inner contact region 336 and the light may mainly be concentrated inside the waveguide core 324. However, due to the curvature of the annular waveguide 304, some amount of light may leak outside of the annular waveguide 304 from the waveguide core 324, for example.

In the example implementation of the ring resonator 302 shown in FIG. 3B, the annular waveguide 304 may be disposed in contact with both the outer contact region 334 and the inner contact region 336. In particular, the outer annular surface 338 of the waveguide base 322 may contact the outer contact region 334 and the inner annular surface 340 of the waveguide base 322 may contact the inner contact region.

Further, the annular detector region 350 may have a radial region 352 and a vertical region 356 formed at a distance from the waveguide core 324. The isolation spacer 316 is formed between the waveguide core 324 and the annular detector region 350. In particular, the annular detector region 350 may have a shorter vertical region 356 as compared to the vertical region 156 of the ring resonator 102 of FIGS. 1A-1B. In one example, the vertical region 356 may have a lower height than the waveguide core 324. In certain examples, the vertical region 356 may extend up to a location where the waveguide base 322 contacts the outer contact region 334. In some examples, the annular detector region 350 annularly contacts the outer contact region 334. Also, the intermediate contact region 362 may be formed on top of the radial region.

The ring resonator 302, the intermediate contact region 362, the annular detector region 350, and the outer contact region 334 are physically coupled to each other in series to create a P-I-N junction. The P-I-N junction may be operated as a PD 354 when a second reverse bias voltage is applied across the third metal contact 364 and the first metal contact 346. The PD 354, when operated by applying the second reverse bias voltage, the annular detector region 350 may absorb the light leakage from the waveguide core 324 resulting in a generation of electric current by the PD 354. The amount of electric current thus generated, is proportional to the amount of the leakage light impinging on the annular detector region 350.

Figure 4A:
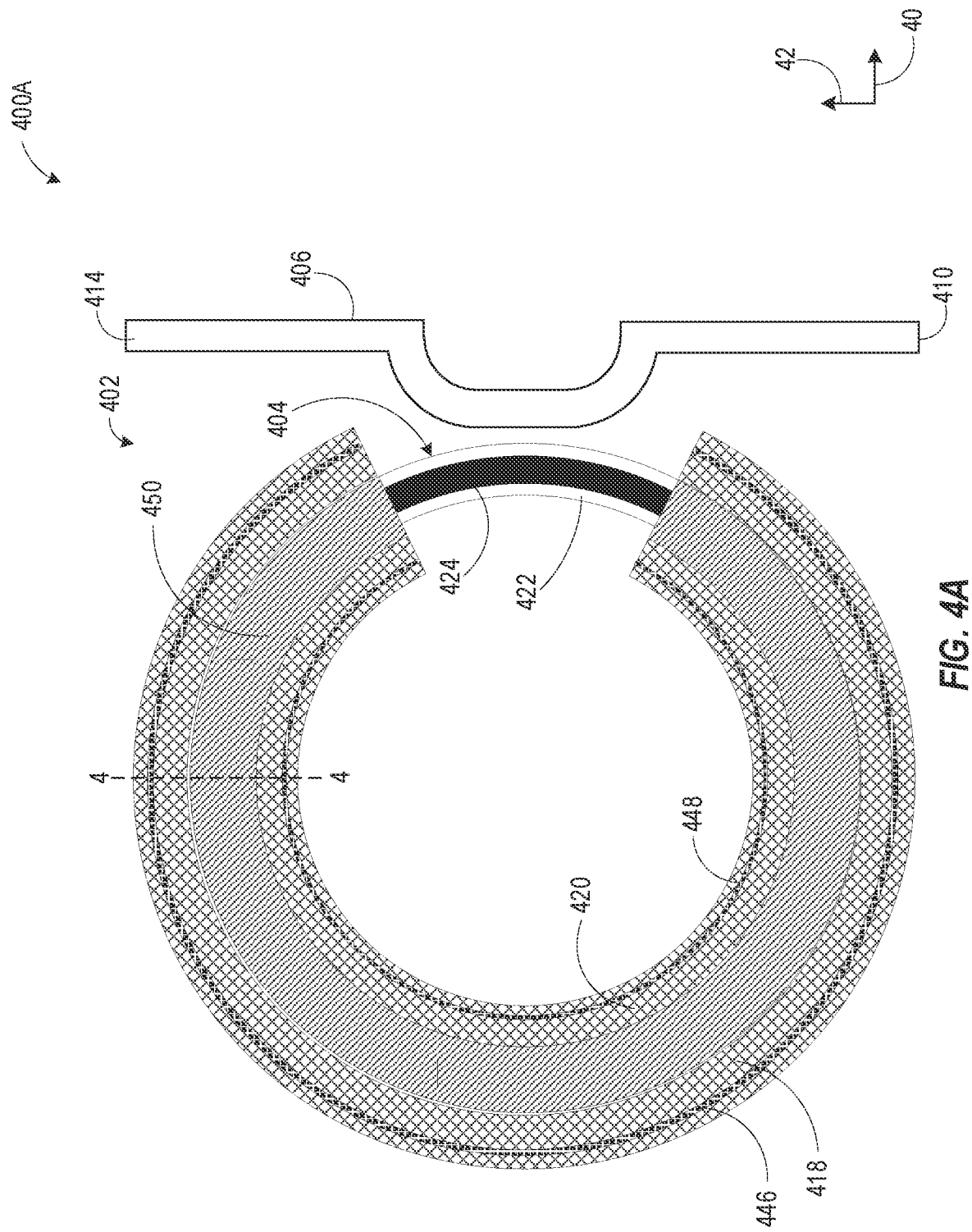
FIG. 4A depicts a top view of a ring resonator, in accordance with yet another example.
Figure 4B:
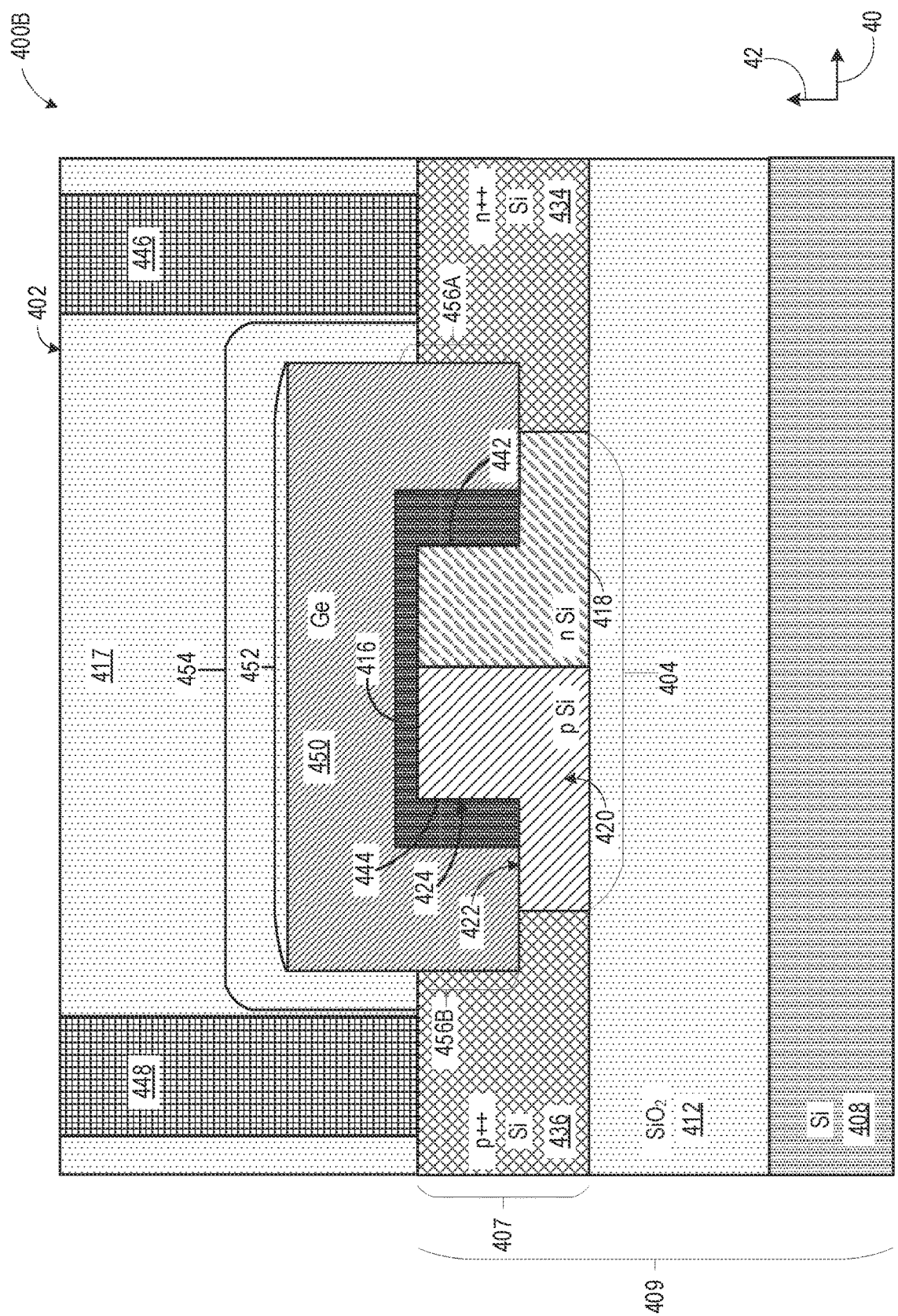
FIG. 4B depicts a cross-sectional view of the ring resonator of FIG. 4A, in accordance with an example.

Turning now to FIGS. 4B and 4A, FIG. 4A depicts a top view 400A of an example ring resonator 402. FIG. 4B depicts a cross-sectional view 400B of the ring resonator 402 taken at location 4-4 marked in FIG. 4A. For clarity of representation, certain regions/layers of the ring resonator 402 are not shown in the top view 400A of FIG. 4A. Further, in FIGS. 4A-4B, arrows 40 and 42 show a radial direction (radial direction 40) and a vertical direction (vertical direction 42), respectively. The ring resonator 402 depicted in FIGS. 4A-4B may be representative of one example of the ring resonator 102 depicted in FIGS. 1A-1C, the ring resonator 202 depicted in FIG. 2, or the ring resonator 302 depicted in FIG. 3B. Accordingly, the ring resonator 402 may include certain features that are similar, in one or more aspects (e.g., geometry, dimension, positioning, material properties, or operation), with similarly named features of the ring resonator 102, the ring resonator 202, or the ring resonator 302, description of which is not repeated herein for the sake of brevity.

For example, the ring resonator 402 may include a wafer 409 having a substrate 408, a base oxide layer 412, and a foundation semiconductor layer 407. Further, the ring resonator 402 may include an annular waveguide 404 having an outer annular region 418 and an inner annular region 420; an outer contact region 234; an inner contact region 436; and a coupling waveguide 406 formed in the foundation semiconductor layer 407. The annular waveguide 404 may have a waveguide core 424 and a waveguide base 422 defined by the outer annular region 418 and an inner annular region 420. Furthermore, the ring resonator 402 may include an isolation spacer 416, an insulating layer 417, and metal contacts 446, 448.

The annular waveguide 404, the coupling waveguide 406, the substrate 408, the base oxide layer 412, the isolation spacer 416, the electrically insulating layer 417, the outer contact region 434, the inner contact region 436, the first metal contact 446, and the second metal contact 448 are disposed in a similar fashion as those of the ring resonator 302 depicted in FIG. 3B. Further, the coupling waveguide 406 may have the input port 410 and the output port 414. Similar to the annular waveguide 104 of FIGS. 1A-1C, the annular waveguide 404 may also be operated by applying a first reverse bias voltage across the outer contact region 434 and the inner contact region 436.

Further, the ring resonator 402 may include an annular detector region 450 is differently shaped in comparison to the annular detector regions 150, 250, or 350 described in FIGS. 1B, 1C, 2, and 3B, however, may have similar material properties as those of the annular detector regions 150, 250, or 350. In particular, the annular detector region 450 may be disposed annularly in contact with both the outer contact region 434 and the inner contact region 436. Moreover, the annular detector region 450 at least partially covers both an outer annular surface 442 and an inner annular surface 444 of the waveguide core 424. To achieve such coverage of the annular surfaces 442 and 444, the annular detector region 450 may have an inverted 'U' shape. In some examples, the annular detector region 450 may include a radial region 452 and two vertical regions 456A and 456B extending from the ends of the radial region 452. The radial region 452 covers a top surface of the waveguide core 424 and the vertical regions 456A and 456B may, fully or partially, cover the outer annular surface 442 and the inner annular surface 444, respectively, at a distance from the waveguide core 424. In particular, the vertical region 456A may extend up to a first location where the waveguide base 422 contacts the outer contact region 434. Similarly, the vertical region 456A may extend up to a second location where the waveguide base 422 contacts the inner contact region 436. As such, in some examples, the vertical regions 456A and 456B may be shorter and may not extend up to the first location and the second location, respectively. In some examples, the vertical regions 456A and 456B may have different heights.

In some examples, an isolation spacer 416 (similar to the isolation spacer 116 shown in FIG. 1A) may be disposed between the annular detector region 450 and the waveguide core 424. In some examples, the thickness of the isolation spacer 416 may be sufficient to allow leakage light to pass there-through. In certain examples, the thickness of the oxide layer may be in a range from 10 nm to 500 nm.

The outer contact region 434, the annular detector region 450, and the inner contact region 436 are physically coupled to each other in series that creates a P-I-N junction which may be operated as a PD 454 when the first reverse bias voltage is applied across the first metal contact 446 and the second metal contact 448. In particular, in comparison to the ring resonators 102 and 302 described in FIGS. 1B and 3, the ring resonator 402 does not require an additional contact region (e.g., the intermediate contact regions 162, 362) and additional metal contacts (e.g., the third metal contacts 164, 364). When the PD 454 is operated by applying the first reverse bias voltage (that is used for primary operation of the ring resonator 402 to bias the annular waveguide 404), the annular detector region 450 may absorb the light leakage from the waveguide core 424 resulting in a generation of electric current by the PD 454. The amount of electric current thus generated, is proportional to the amount of the leakage light impinging on the annular detector region 450.

Figure 5:
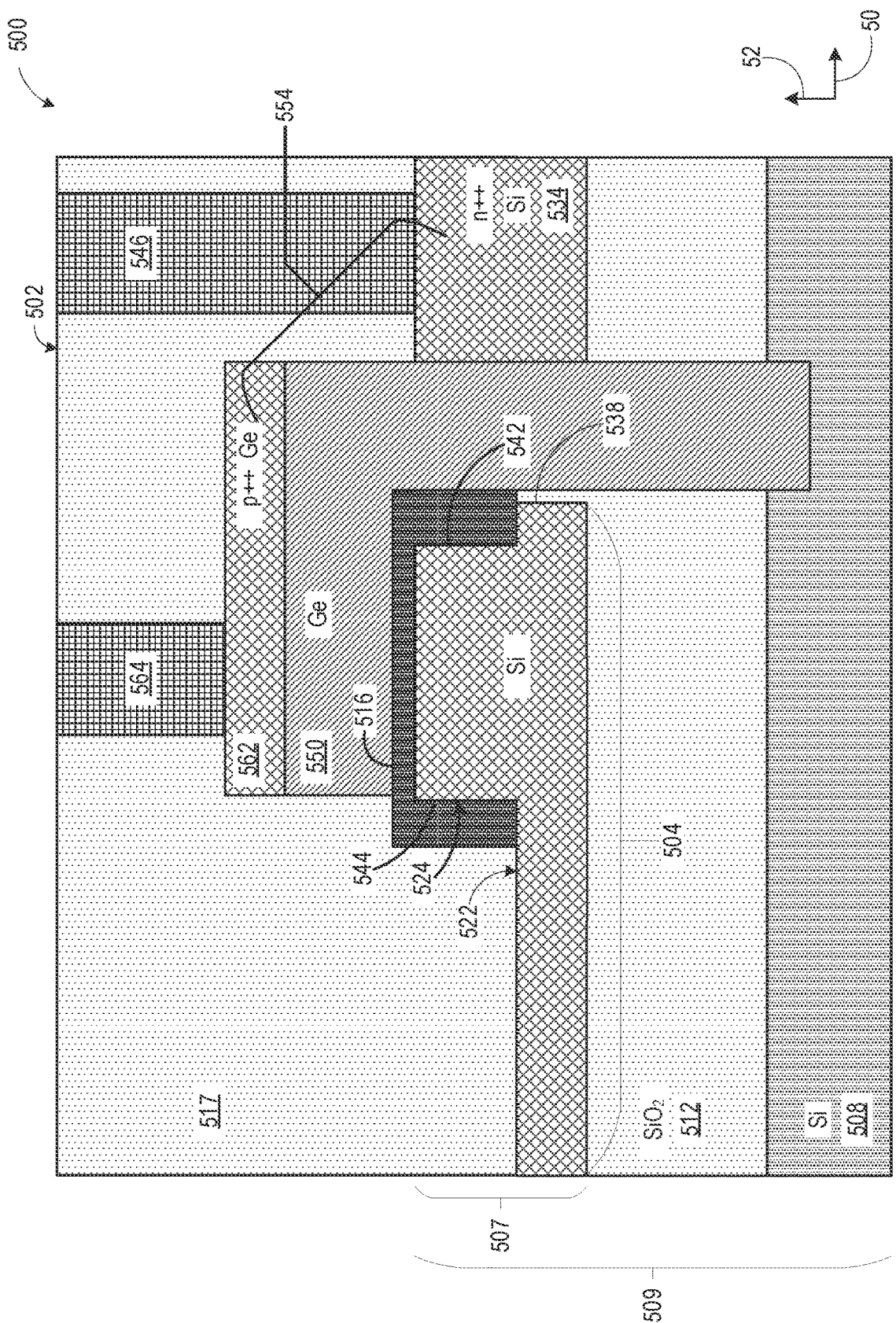
FIG. 5 depicts a cross-sectional view of a ring resonator, in accordance with another example.

FIG. 5 depicts a cross-sectional view 500 of an example ring resonator 502. In FIG. 5, arrows 50 and 52 show a radial direction (radial direction 50) and a vertical direction (vertical direction 52), respectively. The ring resonator 502 depicted in FIG. 5 may be representative of one example of the ring resonator 102 depicted in FIGS. 1A-1C and may be operable as a ring filter. Accordingly, the ring resonator 502 may include certain features that are similar, in one or more aspects (e.g., geometry, dimension, positioning, material properties, or operation), with similarly named features of the ring resonator 102, the ring resonator 102, description of which is not repeated herein for the sake of brevity.

In the example implementation depicted in FIG. 5, the ring resonator 502 may include a wafer 509 having a substrate 508, a base oxide layer 512, and a foundation semiconductor layer 507. Further, the ring resonator 502 may include an annular waveguide 504 and an outer contact region 534; and a coupling waveguide (not shown) formed in the foundation semiconductor layer 507. The annular waveguide 504 may have a waveguide core 524 and a waveguide base 522. Furthermore, the ring resonator 502 may include an isolation spacer 516, an insulating layer 517, an annular detector region 550 (e.g., similar to the annular detector region 150 of FIG. 1), an intermediate contact region 562, and metal contacts 546, 564.

In comparison to the ring resonator 102 of FIG. 1, the ring resonator 502 does not include an inner contact region (e.g., a contact region similar to the inner contact region 136) and respective metal contact (e.g., a metal contact similar to the second metal contact 148). Also, the annular waveguide 504 is differently shaped in comparison to the annular waveguide 104 depicted in FIG. 1B. Further, the waveguide base 522 which is wider in comparison to the waveguide base 122 of FIG. 1. Reference numeral 538 may indicate an outer annular surface of the waveguide base 522. Further, the reference numerals 542 and 544 may respectively represent the outer annular surface and the inner annular surface of the waveguide core 524. The annular waveguide 504 may be made of the first semiconductor material. In particular, the annular waveguide 504 may be made of the first semiconductor material in its intrinsic form.

The coupling waveguide (similar to the coupling waveguide 106, not shown in FIG. 5) may be disposed close to the annular waveguide 504 in a coupling region. From an optical signal supplied at an input port of the coupling waveguide, a light wave having a wavelength equal to a resonant wavelength of the annular waveguide 504 may be coupled into (e.g., trapped inside) the annular waveguide 504. No biasing voltage may be applied to the annular waveguide 504 of FIG. 5. In some examples, the ring resonator 502 may include a heating element (e.g., a resistive heater, not shown) to tune a refractive index of annular waveguide 504, in particular, in the waveguide core 524, thereby tuning light coupling between the annular waveguide 504 and the coupling waveguide.

A PD 554 may be defined by the intermediate contact region 562, the annular detector region 550, and the outer contact region 534. The PD 554 may be operated by applying a reverse bias voltage across the metal contacts 564 546. The PD 154 when operated with the application of the reverse bias voltage, the annular detector region 550 may absorb the leakage light (i.e., radiation modes) from the annular waveguide 504, without affecting any light confined within the annular waveguide 104.

Figure 6:
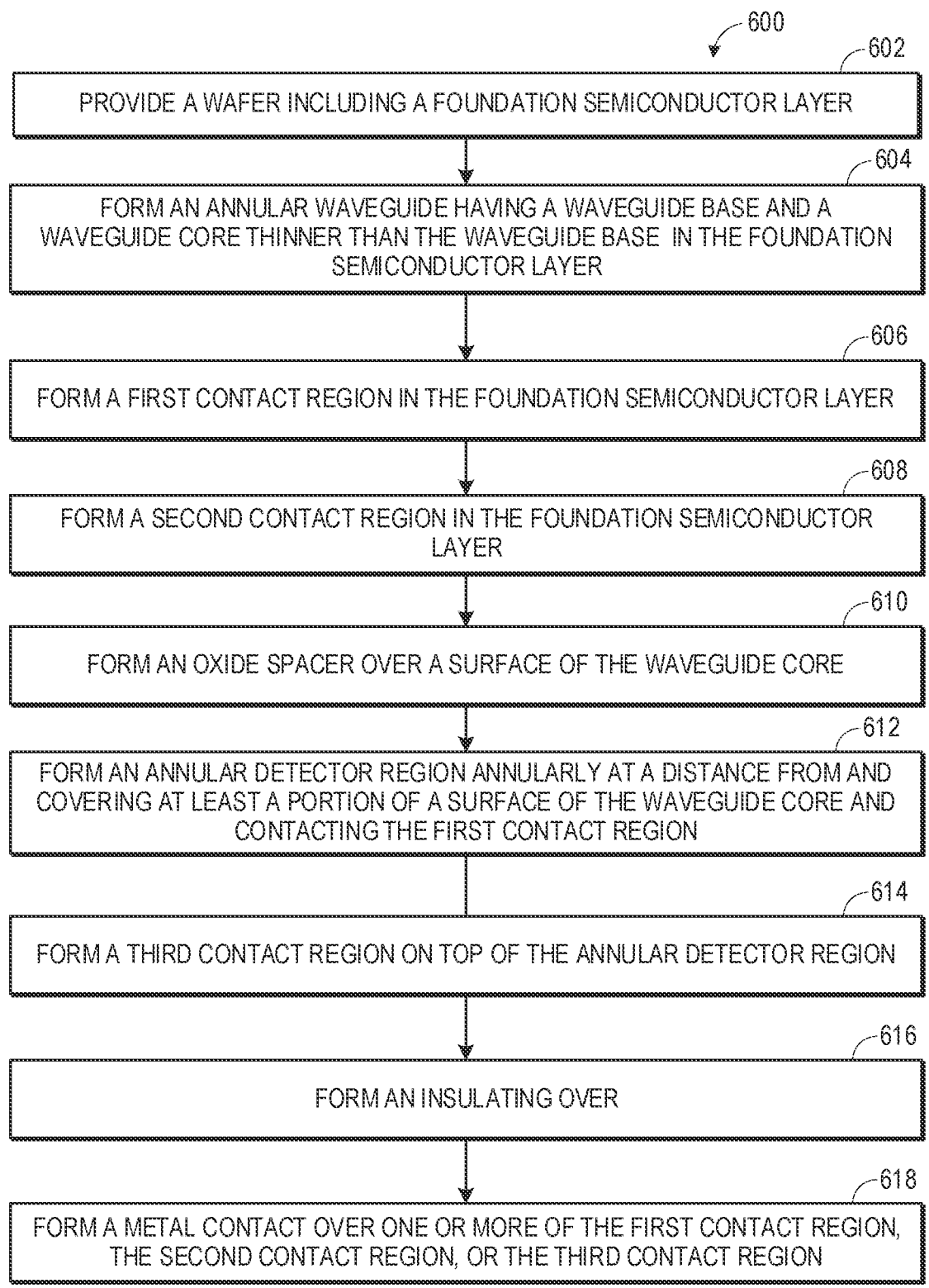
FIG. 6 depicts a flow diagram of a method of forming a ring resonator, in accordance with an example.

Moving now to FIG. 6, a method 600 of fabricating a ring resonator, for example, any of the ring resonators 102, 202, 302, 402, or 502, in accordance with an example. For illustration purposes, a major portion of the method 600 is described with reference to the ring resonator 102 of FIGS. 1A-1C. Method blocks of the method 600 may be performed in series, parallel, or a combination thereof. Further, the method blocks may as well be performed in a different order than depicted in the flow diagram of FIG. 6.

At block 602, a wafer, such as, the wafer 109, including a foundation semiconductor layer 107 made of the first semiconductor material may be provided. Further, at block 604, the annular waveguide 104 may be formed in the foundation semiconductor layer. Forming the annular waveguide 104 may include forming the waveguide base 122 and the waveguide core 124 narrower than the waveguide base 122. Further, at block 606, the outer contact region 134 may be formed in the foundation semiconductor layer 107. The outer contact region 134 may include the first-type doping and is disposed annularly and at least partially surrounding the outer annular surface 138 of the waveguide base 122. Furthermore, in some examples, at block 608, the inner contact region 136 may be formed in the foundation semiconductor layer 107. The inner contact region 136 may include the second-type doping and is disposed annularly contacting the inner annular surface 144 of the waveguide base 122. Formation of the annular waveguide 104, the contact regions 134, 136 at blocks 606-608 may include lithographically defining areas corresponding to each of the annular waveguide 104, the contact regions 134, 136 on the foundation semiconductor layer 107, doping the lithographically defined areas with respective impurities, and/or etching-out portions of the foundation semiconductor layer 107 to form predetermined shapes of the annular waveguide 104, the contact regions 134, 136.

In some examples, at block 610, an isolation spacer (e.g., the isolation spacer 116) may be formed on a surface of the waveguide core 124. To form the isolation spacer 116, a layer of oxide (e.g., $SiO_2$, $Si_3N_4$, $Al_2O_3$, $HfO_2$, polyimide, BCB, or the like) may be formed, via thermal growth techniques and/or using deposition techniques, such as, chemical vapor deposition (CVD), over the exposed surfaces of the annular waveguide 104, the contact regions 134, 136. The layer of oxide may then be etched from areas other than the surface (e.g., the top surface, the outer annular surface 142, and the inner annular surface 144) of the waveguide core 124.

Moreover, at block 612, an annular detector region (e.g., the annular detector region 150) may be formed. In some examples, the annular detector region 150 may include the second semiconductor material and is disposed annularly at a distance from and covering at least a portion of the surface of the waveguide core 124 and contacting the outer contact region 134. In some examples, to form the annular detector region 150, the foundation semiconductor layer 107 and the base oxide layer 112 may be etched from a region where the annular detector region 150 is to be formed and the substrate 108 may be exposed. In some example implementations, the substrate 108 may also be etched up to the predetermined depth. Thereafter, in one example, the second semiconductor material (e.g., Ge may be grown over the substrate 108 and suitably shaped (e.g., etched) to obtain a predetermined shape of the annular detector region as shown in FIGS. 1B-1C, 2, 3, and 4B. In some examples, the second semiconductor material (e.g., Ge) may be deposited on the substrate 108 and suitably shaped (e.g., etched) to obtain the predetermined shape of the annular detector region as shown in FIGS. 1B-1C, 2, 3, and 4B.

Furthermore, in some implementations (e.g., in the examples described in FIGS. 1A-1C, 2, and 3), at block 614, an intermediate contact region (for example, the intermediate contact region 162) including the second-type doping is formed on top of the annular detector region and is disposed annularly contacting the annular detector region. To form the intermediate contact region, a layer of the first semiconductor material may be formed on top of the annular detector region. The layer of the first semiconductor material may then be doped with the respective impurities (depicted in FIGS. 1A-1C, 2, and 3) and shaped/etched to achieve the desired shape.

Additionally, in some examples, at block 616, an insulating layer (e.g., the insulating layer 117) may be formed (e.g., grown or deposited) over exposed surfaces of the annular waveguide, the outer contact region, the inner contact region, and the annular detector. Also, at block 618, one or more metal contacts (e.g., the metal contacts 146, 148, or 164 may be formed in contact with the contact regions 134, 136, or 162, respectively. To form the metal contacts 146, 148, 164 the electrically insulating layer 117 may be etched or lithographically defined to form respective vias until the respective contact regions 134, 136, or 162 are reached. Once the vias are formed, a conducting material (e.g., metal) is filled into the vias to form the metal contacts 146, 148, or 164.

The terms 'radially' and 'vertically' may be interpreted as "along a radial direction" and "along a vertical direction," respectively. In some examples, the radial direction and the vertical direction may be oriented at a non-zero angle from each other. In certain examples, the radial direction and the vertical direction may be orthogonal to each other. Further, the term, "radially outward direction" may refer a direction moving away from a reference point. Unless otherwise specified, the reference point will be assumed to coincide with the center of symmetry, for example, the center of the ring of a ring resonator. In other words, the radially outward direction may be same as a direction pointed by an arrow marked with the radial direction in the respective drawings. The term, "radially inward direction" may refer a direction moving toward the reference point. In other words, the radially inward direction may be a direction opposite the radially outward direction. Unless otherwise specified, "width" or "thickness" refers to radial distance and "height" refers to vertical distance. Further, in the description hereinafter, the term "optical signal" refer to light that may include light waves of one or more wavelengths.

The terminology used herein is for the purpose of describing particular examples and is not intended to be limiting. As used herein, the singular forms "a," "an," and "the" are intended to include the plural forms as well, unless the context clearly indicates otherwise. The term "another," as used herein, is defined as at least a second or more. The term "coupled to" as used herein, is defined as connected, whether directly without any intervening elements or indirectly with at least one intervening element, unless indicated otherwise. For example, two elements may be coupled to each other mechanically, electrically, optically, or communicatively linked through a communication channel, pathway, network, or system. Further, the term "and/or" as used herein refers to and encompasses any and all possible combinations of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

While certain implementations have been shown and described above, various changes in form and details may be made. For example, some features and/or functions that have been described in relation to one implementation and/or process may be related to other implementations. In other words, processes, features, components, and/or properties described in relation to one implementation may be useful in other implementations. Furthermore, it should be appreciated that the systems and methods described herein may include various combinations and/or sub-combinations of the components and/or features of the different implementations described. Moreover, method blocks described in various methods may be performed in series, parallel, or a combination thereof. Further, the method blocks may as well be performed in a different order than depicted in flow diagrams.

Further, in the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A ring resonator, comprising:
an annular waveguide comprising a waveguide base and a waveguide core narrower than the waveguide base;
an outer contact region comprising a first-type doping and disposed annularly and at least partially surrounding an outer annular surface of the waveguide base; and
an annular detector region disposed annularly at a distance from and covering at least a portion of a surface of the waveguide core and contacting the outer contact region, wherein the annular detection region is physically isolated from the waveguide core.

2. The ring resonator of claim 1, further comprising an isolation spacer disposed between the annular detector region and the waveguide core.

3. The ring resonator of claim 2, wherein the isolation spacer is thin enough to allow the annular detector region to absorb leakage light from the annular waveguide.

4. The ring resonator of claim 2, wherein a thickness of the isolation spacer is in a range from 10 nm to 500 nm.

5. The ring resonator of claim 1, further comprising an inner contact region comprising a second-type doping and disposed annularly contacting an inner annular surface of the waveguide base, wherein the annular detector region is disposed in contact with both the outer contact region and the inner contact region, and wherein the annular detector region surrounds at least partially both an outer annular surface of the waveguide core and an inner annular surface of the waveguide core.

6. The ring resonator of claim 1, wherein the annular detector region at least partially surrounds at least an outer annular surface of the waveguide core.

7. The ring resonator of claim 6, further comprising an intermediate contact region comprising a second-type doping and disposed annularly contacting the annular detector region.

8. The ring resonator of claim 1, further comprising a substrate and a base oxide layer is disposed on the substrate, wherein the annular waveguide and the outer contact region are formed on top of the base oxide layer.

9. The ring resonator of claim 8, wherein the annular detector region comprises a radial region formed over the waveguide core and a vertical region extending from the radial region via a region between the outer contact region and the waveguide base, wherein the vertical region extends up to the substrate through the base oxide layer.

10. The ring resonator of claim 8, wherein the annular detector region comprises a radial region formed over the waveguide core and a vertical region extending from the radial region via a region between the outer contact region and the waveguide base, wherein the vertical region extends up to a predetermined depth into the substrate through the base oxide layer.

11. The ring resonator of claim 1, wherein the outer contact region is disposed in continuous annular contact with the outer annular surface of the waveguide base.

12. A ring resonator, comprising:
an annular waveguide formed of a first semiconductor material, wherein the annular waveguide comprises a waveguide base and a waveguide core narrower than the waveguide base;
an outer contact region comprising a first-type doping and disposed annularly and at least partially surrounding an outer annular surface of the waveguide base;
an inner contact region comprising a second-type doping and disposed annularly contacting an inner annular surface of the waveguide base; and
an annular detector region formed of a second semiconductor material and disposed annularly at a distance from and covering at least a portion of a surface of the waveguide core and contacting the outer contact region, wherein the annular detector region comprises a radial region formed over the waveguide core and a vertical region extending from the radial region via a region between the outer contact region and the waveguide base, wherein the vertical region extends up to a predetermined depth into a substrate through a base oxide layer, wherein the annular waveguide, the outer contact region, the inner contact region, and the annular detector region are formed over the base oxide layer disposed on the substrate.

13. The ring resonator of claim 12, wherein at least a portion of the outer contact region contacts a portion of the outer annular surface of the waveguide base.

14. The ring resonator of claim 12, further comprising an isolation spacer disposed between the annular detector region and the waveguide core.

15. The ring resonator of claim 14, wherein the isolation spacer to allow leakage light to pass there-through.

16. A method comprising:
providing a wafer comprising a foundation semiconductor layer;
forming an annular waveguide in the foundation semiconductor layer, the annular waveguide comprising a waveguide base and a waveguide core narrower than the waveguide base;
forming an outer contact region in the foundation semiconductor layer, the outer contact region comprising a first-type doping and disposed annularly and at least partially surrounding an outer annular surface of the waveguide base;
forming an inner contact region in the foundation semiconductor layer, the inner contact region comprising a second-type doping and disposed annularly contacting an inner annular surface of the waveguide base; and
forming an annular detector region annularly at a distance from and covering at least a portion of a surface of the waveguide core and contacting the outer contact region, wherein the annular detection region is physically isolated from the waveguide core.

17. The method of claim 16, further comprising forming an isolation spacer over the surface of the waveguide core, wherein the annular detector region is separated from the waveguide core via the isolation spacer.

18. The method of claim 16, further comprising forming an intermediate contact region comprising the second-type doping on top of the annular detector region and disposed annularly contacting the annular detector region.

19. The method of claim 16, further comprising:
forming an insulating over the annular waveguide, the outer contact region, the inner contact region, and the annular detector region; and
forming a metal contact over one or both of the outer contact region and the inner contact region.

20. The ring resonator of claim 1, wherein the annular detector region comprises a semiconductor material in an intrinsic form.

* * * * *